(12) United States Patent
Umemoto

(10) Patent No.: US 6,765,283 B2
(45) Date of Patent: Jul. 20, 2004

(54) SEMICONDUCTOR DEVICE WITH MULTI-LAYER INTERLAYER DIELECTRIC FILM

(75) Inventor: Takeshi Umemoto, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/201,646

(22) Filed: Jul. 24, 2002

(65) Prior Publication Data

US 2003/0020175 A1 Jan. 30, 2003

(30) Foreign Application Priority Data

Jul. 24, 2001 (JP) ........................................ 2001-223328

(51) Int. Cl.⁷ .............................................. H01L 23/58
(52) U.S. Cl. .......................... 257/637; 257/650; 257/774
(58) Field of Search ................................ 257/637, 650, 257/774; 438/738

(56) References Cited

U.S. PATENT DOCUMENTS 6,024,888 A * 2/2000 Watanabe et al. ............. 216/73
6,163,067 A * 12/2000 Inohara et al. .............. 257/635
6,165,891 A * 12/2000 Chooi et al. ................ 438/622

FOREIGN PATENT DOCUMENTS

JP         10-150105         6/1998

* cited by examiner

Primary Examiner—Thien F Tran
(74) Attorney, Agent, or Firm—Nixon & Vanderhye P.C.

(57) ABSTRACT

A semiconductor device comprising: an underlayer interconnect layer; an interlayer dielectric film formed with a connection hole reaching the underlayer interconnect layer; and an upper interconnect layer buried in the connection hole, wherein the interlayer dielectric film includes an insulating film containing an impurity for detecting a first etching end point, a first insulating film, an insulating film containing an impurity for detecting a second etching end point and a second insulating film, these four films being laminated in this order.

15 Claims, 3 Drawing Sheets

SEMICONDUCTOR DEVICE WITH MULTI-LAYER INTERLAYER DIELECTRIC FILM

CROSS-REFERENCE TO RELATED APPLICATION

This application is related to Japanese application No. 2001-223328 filed on Jul. 24, 2001, whose priority is claimed under 35 USC § 119, the disclosure of which is incorporated by reference in its entirety.

BACKGROUND OF THE INVENTION

1. Field of the Invention

The present invention relates to a semiconductor device and a method for fabricating the same, more specifically, to a semiconductor device using an insulating film at least in a part of an interlayer dielectric film and a method for fabricating the same, the insulating film has a relative dielectric constant lower than that of silicon nitride and contains an impurity capable of detecting an etching end point.

2. The Related Art

With miniaturization and high integration of semiconductor devices, scaling down of internal interconnects and realization of multilayer internal interconnects have been proceeding. According with this, demands for planarization techniques of interlayer dielectric films and microfabrication such as dry etching have been more severe. Then, to meet these demands, a buried interconnect technique has been studied.

In the buried interconnect technique, a trench for an interconnect pattern is formed in an interlayer dielectric film, the inside of the trench is buried with an interconnect material, and then the interconnect material other than the inside of the trench is removed to leave the interconnect material only inside the trench. Thus, the interconnect portion is formed in a shape of burying it in the interlayer dielectric film. Accordingly, it is more advantageous in the planarization of the interlayer dielectric film than a traditional multilevel metallization technique, allowing a copper (Cu) interconnect, which has been difficult in processing by traditional RIE (Reactive Ion Etching). The Cu interconnect has low resistance and high reliability, thus attracting attention as a next generation interconnect material.

In such the buried interconnect technique, an etching stopper film is deposited in an interlayer dielectric film in general. Etching is performed under the condition that a selected ratio is great to this etching stopper film, whereby a trench and a connection hole for buried interconnect are formed in the interlayer dielectric film. As the etching stopper film, a silicon nitride film is used in the case of an $SiO_2$ based interlayer dielectric film, for example.

However, the silicon nitride film has a relative dielectric constant of about seven, significantly greater than that of $SiO_2$ systems, about four, increasing the relative dielectric constant of the entire interlayer dielectric film. Consequently, it is known to generate defects leading to signal delay or an increase in power consumption.

Then, Japanese Unexamined Patent Publication No. HEI 10(1998)-150105, for example, has been proposed a method of using an organic low dielectric constant film as an etching stopper film for the purpose of reducing the capacitance of an interlayer dielectric film, the organic low dielectric constant film has a relative dielectric constant lower than that of a silicon nitride film and contains fluorine.

According to this method, as shown in FIG. 3A, an underlayer insulating film 12 comprised of silicon oxide is deposited as a part of an interlayer dielectric film on a semiconductor substrate 11 by CVD using mono-silane and an oxygen gas as source gas. An organic low dielectric constant film 13 having a relative dielectric constant lower than that of silicon nitride is deposited thereon by spin coating, for example. An insulating film 14 comprised of a silicon oxide film as similar to the underlayer insulating film 12 and an organic low dielectric constant film 15 as similar to the organic low dielectric constant film 13 are deposited thereon.

Subsequently, a resist film (not shown) is deposited on the organic low dielectric constant film 15. The resist film is patterned by a photolithography process to form an opening over an area for forming a trench for buried interconnect. The resist film is used as a mask to etch the organic low dielectric constant film 15 as shown in FIG. 3B. Then, the insulating film 14 is etched to form a trench 16 for buried interconnect in the organic low dielectric constant film 15 and the insulating film 14.

After that, as shown in FIG. 3C, an interconnect layer 17 is formed inside the trench 16 by damascene.

Subsequently, as shown in FIG. 3D, an insulating film 18 comprised of a silicon oxide film as similar to the underlayer insulating film 12 and the insulating film 14 is deposited over the entire surface of the organic low dielectric constant film 15 and the interconnect layer 17.

A resist film (not shown) is deposited on the insulating film 18. The resist film is patterned by the photolithography process to form an opening over an area for forming a connection hole to the interconnect layer 17. As shown in FIG. 3E, the resist film is used as a mask to etch the insulating film 18, and a connection hole 19 reaching the interconnect layer 17 is formed in the insulating film 18.

Furthermore, as shown in FIG. 3F, a plug 20 comprised of tungsten, for example, is buried inside the connection hole 19.

After that, an upper interconnect is formed on the insulating film 18 in a pattern of connecting to the plug 20.

However, as described above, when the organic low dielectric constant film containing relatively plenty of fluorine is used as the etching stopper film for the purpose of decreasing interlayer capacitance, a problem is arisen that reaction products are generated greatly in the bottom of the trench and the connection hole while etching the interlayer dielectric film and the reaction products increase the electric resistance in interconnection.

SUMMARY OF THE INVENTION

The invention was made in view of the problems. The purpose is to provide a semiconductor device and a method for fabricating the same, the semiconductor device is capable of reducing interlayer capacitance, terminating etching by controlling endpoint detection highly accurately, not by etching stop utilizing a high selected ratio, and performing etching with fewer reaction products, and has interconnections of low electric resistance.

According to the invention, provided is a semiconductor device comprising:

an underlayer interconnect layer;

an interlayer dielectric film formed with a connection hole reaching the underlayer interconnect layer; and an upper interconnect layer buried in the connection hole, wherein the interlayer dielectric film includes an insulating film containing an impurity for detecting a first etching end point, a first insulating film, an insulating film containing an impurity for detecting a second etching end point and a second insulating film, these four films being laminated in this order.

Additionally, according to the invention, provided is a method for fabricating a semiconductor device comprising the steps of:

forming an insulating film containing an impurity for detecting a first etching end point, a first insulating film, an insulating film containing an impurity for detecting a second etching end point, and a second insulating film on an underlayer interconnect layer in this order;

forming a connection hole by etching, the connection hole reaching from the surface of the second insulating film to the insulating film containing the impurity for detecting the first etching end point;

forming a protection film in the bottom of the connection hole;

forming a trench by etching, the trench reaching from the surface of the second insulating film to the insulating film containing the impurity for detecting the second etching end point and connecting with the connection hole; and removing the protection film, and thereafter, burying a conductive material in the connection hole and the trench, thereby forming an upper interconnect layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1A:
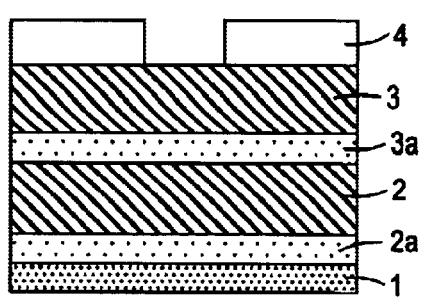
FIGS. 1A to 1E are schematic sectional views of the process illustrating the fabricating the semiconductor device of the invention

The semiconductor device of the invention mainly has an underlayer interconnect layer, an interlayer dielectric film, and an upper interconnect layer.

As the underlayer interconnect layer, any of those being utilized as the interconnect layer of semiconductor devices is acceptable in general; named are those formed of conductive materials such as an impurity diffused layer, electrodes, and interconnects formed on a semiconductor substrate. More specifically, named are metals such as aluminum, copper, gold, silver, and nickel, or alloys of these; high melting point metals such as tantalum, titanium, and tungsten, or alloys of these; and a single layer or layered film formed of silicide or polyside of polysilicon and high melting point metals.

The interlayer dielectric film deposited over the underlayer interconnect layer is configured by sequentially laminating at least an insulating film containing an impurity for detecting a first etching end point, a first insulating film, an insulating film containing an impurity for detecting a second etching end point, and a second insulating film in this order.

The insulating film containing the impurity for detecting the first etching end point and the insulating film containing the impurity for detecting the second etching end point are insulating films for detecting etching end points for the first insulating film and the second insulating film, described later, respectively. In consideration of functioning as the interlayer dielectric film, a film having a low dielectric constant is preferable. Additionally, it dose not necessarily have a greater selected ratio to the first insulating film and the second insulating film, described later. Materials for these films can be properly selected according to the method for detecting the etching end points and the materials for the first and second insulating films, described later. Here, as a method for detecting the etching end point of the interlayer dielectric film, named is a method of monitoring luminescence intensities in gas during etching.

For example, impurities contained in the insulating film containing the impurity for detecting the first etching end point and the insulating film containing the impurity for detecting the second etching end point are preferably elements not contained in the first and second insulating films, described later. For example, phosphorous, arsenic, boron, and fluorine are named. Concentrations of these impurities are about 1.0 to 5.0 mol %. Furthermore, the insulating films containing impurities preferably have a dielectric constant of about four or under. More specifically, named are a $SiO_2$, a SiOF, a SiOC or a CF based film which is formed by a CVD method, and an SOG, HSQ (hydrogen silsesquioxane), an MSQ (methyl silsesquioxane), a PAE (polyarylene ether) or a BCB (benzo cyclobutene) based film which is formed by coating. The insulating films containing the impurities for detecting the first and second etching end points are not necessarily the same films. Among these, both are preferably a phosphorus silicate glass film. The film thickness of these films is not defined particularly, but it is necessary to have a film thickness that is not fully removed even though the first and second insulating films, described later, are over etched. More specifically, it is preferably about 10 to 50 nm.

The first and second insulating films are not defined particularly when they are materials configuring interlayer dielectric films in general. For example, those similar to the insulating films described above are named. Among these, a silicon oxide film is preferable. The film thickness of these insulating films is not defined particularly; they are preferably adjusted about 500 to 2000 nm as the entire interlayer dielectric films.

It is acceptable that the upper interconnect layer is any of these being utilized as interconnect layers for semiconductor devices in general. It can be formed of materials similar to those exemplified as the underlayer interconnect layer. Additionally, the upper interconnect layer is formed as being buried in the trench formed in the surface of the interlayer dielectric film. Preferably, the top surfaces of the interlayer dielectric film and the upper interconnect layer are matched. Furthermore, generally, the connection hole reaching the underlayer interconnect layer is formed inside the trench buried with the upper interconnect layer. The upper interconnect layer may be buried into the connection hole, or the upper interconnect layer may be formed so as to be connected to a contact plug, the contact plug is formed in the connection hole separately from the upper interconnect layer. Moreover, the contact plug can be formed of a single layer or layered film of conductive materials generally used for connecting interconnect layers.

Besides, in the method for fabricating the semiconductor device of the invention, first, the insulating film containing the impurity for detecting the first etching end point, the first insulating film, the insulating film containing the impurity for detecting the second etching end point, and the second insulating film are sequentially deposited on the underlayer interconnect layer in this order. These insulating films can be deposited by selecting various publicly known methods such as sputtering, vacuum deposition, the electron beam process, CVD, plasma CVD, spin coating, the doctor blade process, and the sol-gel process. Additionally, in the insulating films containing impurities, impurities can be introduced by ion injection, solid phase diffusion or vapor phase diffusion after the insulating film is deposited, or impurities can be introduced into raw materials of the insulating film to deposit the insulating film containing the impurities.

Then, the connection hole reaching from the surface of the second insulating film to the insulating film containing the impurity for detecting the first etching end point is formed by etching. For etching in this case, various etching methods are named such as wet etching or dry etching, but dry etching is preferable. Etching is terminated when at least the second insulating film, the insulating film containing the impurity for detecting the second etching end point and the first insulating film are fully penetrated and etching for the insulating film containing the impurity for detecting the first etching end point is confirmed. The confirmation of etching for the insulating film containing the impurity for detecting the first etching end point can be performed surely and simply by performing monitoring as described above and detection of the impurity for detecting the first etching end point.

Subsequently, a protection film is formed in the bottom of the connection hole. Kinds of the protection film here are not defined particularly, but an organic protection film is appropriate in consideration of forming the protection film only in the bottom of the connection hole and removal of the protection film. It is acceptable that the protection film is formed over the entire surface of the interlayer dielectric film including the connection hole and the protection film formed in the area other than the bottom of the connection hole is removed by etching or lift-off, or that it is formed only in the bottom of the connection hole by spin coating. The film thickness of the protection film is not defined particularly. It can be adjusted properly by materials for each layer configuring the interlayer dielectric film and etching conditions.

Then, the trench is formed by etching, the trench reaches from the surface of the second insulating film to the insulating film containing the impurity for detecting the second etching end point and connects with the connection hole. The formation of the trench here can be performed as similar to the formation of the connection hole described above. In addition, either of the connection hole and the trench may be formed beforehand; when the trench is formed beforehand, it is appropriate that the connection hole is formed so as to be placed inside the trench. Furthermore, when the trench is formed beforehand, the protection film is preferably formed in the bottom of the trench, not in the bottom of the connection hole.

Moreover, after this process, the protection film formed in the bottom of the connection hole (or the bottom of the trench) and the insulating films containing the impurities for detecting the first and second etching end points are preferably almost fully removed before the subsequent process where a conductive material is buried in the connection hole and the trench. These films can be removed by selecting proper conditions according to wet etching and dry etching.

Besides, the conductive material is buried in the connection hole and the trench. For the conductive material here, the material films exemplified in the above-described upper interconnect layer are named. The conductive material can be buried by depositing a conductive material film over the entire surface of the second insulating film to etch back the conductive material film until the surface of the second insulating film is exposed. Etch back can be performed by CMP, for example. Additionally, it is acceptable that the connection hole and the trench are buried with the same material film by the same process, or that the connection hole is first buried with the conductive material film and the trench is further buried with the same or different conductive material film.

Hereafter, the semiconductor device of the invention and the method for fabricating the same will be described with reference to the drawings.

First, as shown in FIG. 1A, a phosphorus silicate glass film containing phosphorus (PSG film having a relative dielectric constant of about four), for example, is deposited about 10 to 50 nm in film thickness on an interconnect layer 1 formed on a semiconductor substrate as an insulating film 2a for detecting a first etching end point. A silicon oxide film (P-tetraethoxysilane (TEOS) film) by plasma deposition using a TEOS gas and an $O_2$ gas as raw material is deposited about 250 to 750 nm in film thickness thereon as an insulating film 2. A PSG film as similar to the insulating film 2a is deposited about 10 to 50 nm in film thickness further thereon as an insulating film 3a for detecting a second etching end point. A P-TEOS film as similar to the insulating film 2 is deposited about 250 to 750 nm in film thickness thereon as an insulating film 3. A resist pattern 4 for forming a connection hole is formed thereon by a photolithography process.

Figure 1B:
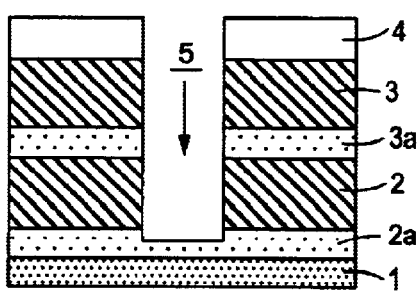

Subsequently, as shown in FIG. 1B, the resist pattern 4 is used as a mask to form a connection hole 5 by etching. Etching at this time is performed where source power/bias power is 2170W/1800W, pressure is 20 mTorrs, and a $C_5F_8$ gas, Ar gas and $O_2$ gas are used as etching gas. Furthermore, during etching, a spectrometer is used to monitor luminescence intensities of plasma gas, and termination of etching is determined by detecting changes in the luminescence intensities of the spectrometer corresponding to the period of time while the insulating film 2a for detecting the first etching end point is being etched in the stage nearly finishing etching.

Figure 2:
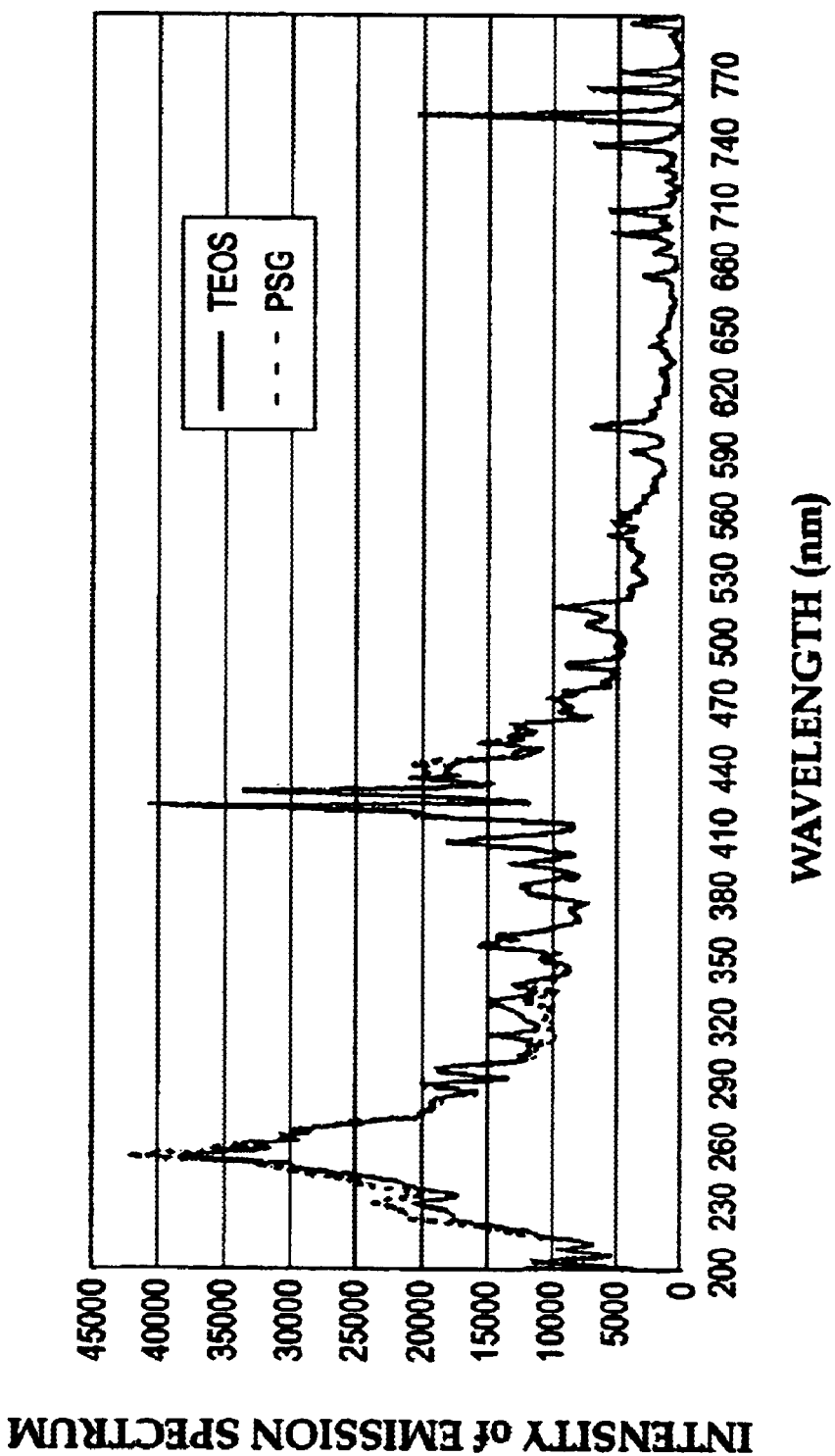
FIG. 2 is the emission spectra of the spectrometer while the interlayer dielectric film is being etched.
Figure 3A:
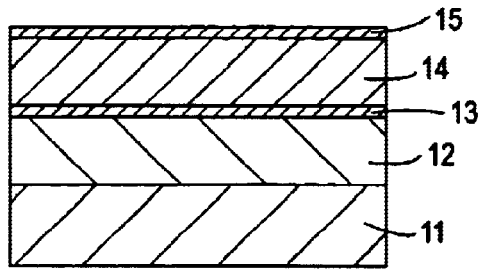
FIGS. 3A to 3F are schematic sectional views of the process illustrating the fabricating the semiconductor device of the prior art.
Figure 3B:
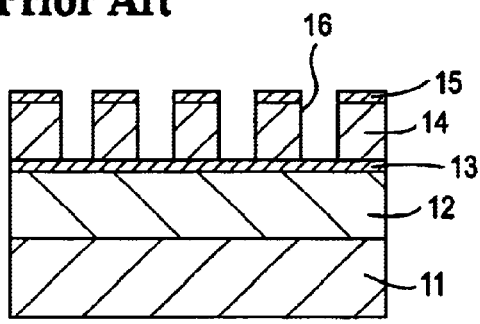
Figure 3C:
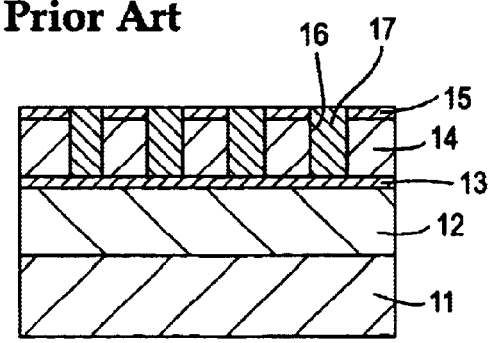
Figure 3D:
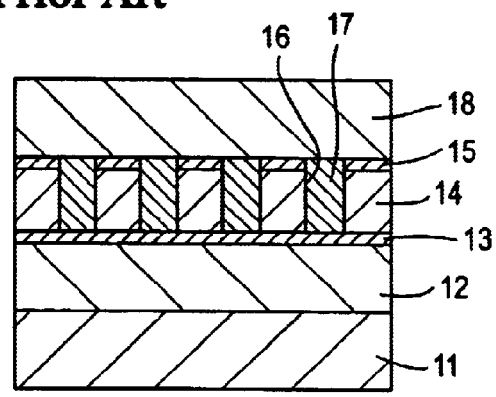
Figure 3E:
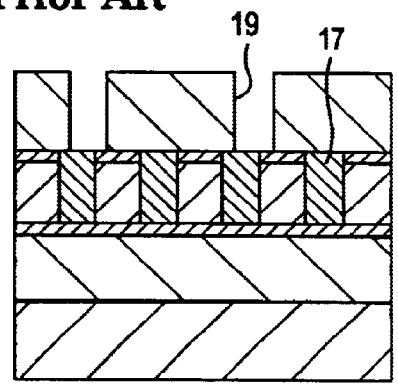
Figure 3F:
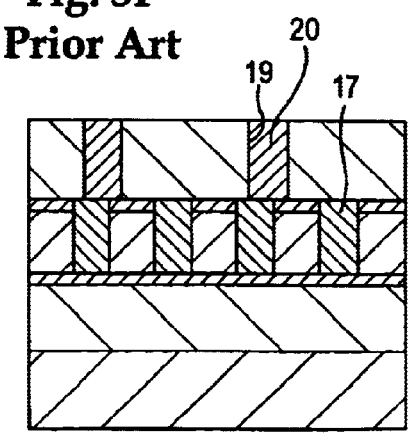

More specifically, as shown in FIG. 2, the emission spectra of the spectrometer while the insulating film 2a for detecting the first etching end point is being etched, the insulating film 2a is formed of the PSG film, shows that the luminescence intensity is great near a wavelength of about 253 nm as compared with the period of time while etching the insulating film 2 formed of the P-TEOS film. This is a wavelength of a chemical/electron pair of phosphorus contained in the PSG film. According to the emission spectra at this wavelength, the termination of etching can be determined.

Subsequently, the resist pattern 4 is removed by ashing.

Figure 1C:
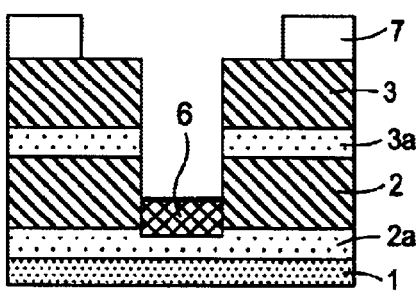

Then, as shown in FIG. 1C, an organic based bottom anti-reflective coating (BARC) 6 is deposited in the bottom of the connection hole by spin coating at a rotation of about 1000 to 4000 rpm. After that, a resist is coated over the entire surface of the semiconductor substrate obtained, and a resist pattern 7 for forming trench interconnect is formed by a photolithography process.

The organic based bottom anti-reflective coating 6 in the bottom of the connection hole 5 was formed in order not to etch the interconnect layer 1 due to the bottom of the connection hole 5 being etched during etching in the subsequent process.

Figure 1D:
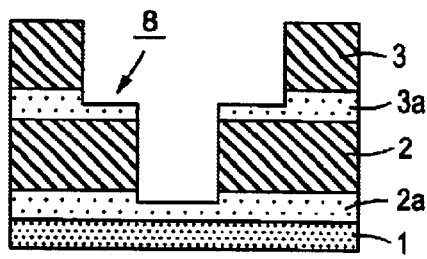

Then, as shown in FIG. 1D, the resist pattern 7 for forming the trench interconnect is used as a mask to form a trench 8. The trench 8 is formed in which etching is performed while luminescence intensities of the spectrometer is being monitored and changes in the luminescence intensities of the spectrometer corresponding to the period of time while the insulating film 3a for detecting the second etching end point is being etched are detected to terminate etching, as described above.

Figure 1E:
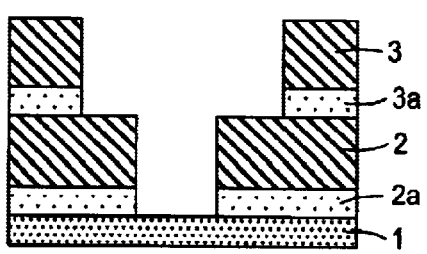

Subsequently, as shown in FIG. 1E, the resist pattern 7 and the organic bottom anti-reflective coating 6 in the bottom of the connection hole 5 are removed by ashing. Furthermore, the insulating film 2a for detecting the first etching end point and the insulating film 3a for detecting the second etching end point are removed by etching.

After that, conductive materials are buried in the connection hole 5 and the trench 8 by a publicly known method, and the formation of the trench interconnect part is completed.

In this manner, the PSG film is interposed in the interlayer dielectric film, whereby the detection of the etching end point can be performed surely.

According to the invention, the interlayer dielectric film is configured by sequentially laminating the insulating film containing the impurity for detecting the first etching end point, the first insulating film, the insulating film containing the impurity for detecting the second etching end point, and the second insulating film in this order. Therefore, the realization of a lower dielectric constant in the interlayer dielectric film which is a problem in the scaled down semiconductor devices can be attained without using a silicon nitride film having a higher dielectric constant generally used as the etching stopper for the first and second insulating films. A semiconductor device intending the reduction in capacitance of the interlayer dielectric film and preventing signal delay or an increase in power consumption can be obtained.

In addition, according to the invention, etching can be terminated by detecting the impurities contained in the insulating films, not by etching stop based on the difference in a selected ratio in etching the first and second insulating films. Thus, the etching end point can be determined easily, simply, surely and highly accurately, avoiding excessive over etching. Also, performing such the determination of the etching end point leads to allowing the prevention of reaction products from being left in the connection hole or trench, the reaction products are generated during etching, and allowing the avoidance of an increase in electric resistance and connection failure caused by the reaction products. A semiconductor device having high reliability can be fabricated as an improvement in yields and a reduction in fabrication costs are intended.

What is claimed is:

1. A semiconductor device comprising:
   an underlayer interconnect layer;
   an interlayer dielectric film formed with a connection hole reaching the underlayer interconnect layer; and
   an upper interconnect layer buried in the connection hole,
   wherein the interlayer dielectric film includes a first insulating film containing an impurity for detecting a first etching end point, a second insulating film, a third insulating film containing an impurity for detecting a second etching end point and a fourth insulating film, these four films being laminated in this order,
   wherein the impurity concentration in each of the first and third insulating films is sufficient to cause the first and third insulating films to generate different spectral luminance of gas produced during etching than the second and fourth insulating films, respectively; and
   wherein the impurities are contained in a concentration of 1 to 5 mol % in each of the first and third insulating films.

2. A semiconductor device according to claim 1, wherein the second insulating film and the fourth insulating film comprise silicon oxide.

3. A semiconductor device according to claim 1, wherein the first insulating film containing the impurity for detecting the first etching end point and the third insulating film containing the impurity for detecting the second etching end point each have a dielectric constant of 4 or less.

4. The semiconductor device according to claim 1, wherein at least one of the first insulating film containing the impurity for detecting the first etching end point and the third insulating film containing the impurity for detecting the second etching end point contains at least one of phosphorus, arsenic, boron or fluorine as the impurity.

5. A semiconductor device comprising:
   an underlayer interconnect layer;
   an interlayer dielectric film formed with a connection hole reaching the underlayer interconnect layer;
   an upper interconnect layer buried in the connection hole;
   wherein the interlayer dielectric film includes a first insulating film containing an impurity for detecting a first etching end point, a second insulating film, a third insulating film containing an impurity for detecting a second etching end point and a fourth insulating film, these four films being laminated in this order;
   wherein the first insulating film containing the impurity for detecting the first etching end point and the third insulating film containing the impurity for detecting the second etching end point contain at least one of phosphorus, arsenic, boron or fluorine as the impurity; and
   wherein the impurities are contained in a concentration of 1 to 5 mol % in each of the first and third insulating films.

6. A semiconductor device comprising:
   an underlayer interconnect layer;
   an interlayer dielectric film formed with a connection hole reaching the underlayer interconnect layer;
   an upper interconnect layer buried in the connection hole;
   wherein the interlayer dielectric film includes a first insulating film containing an impurity for detecting a first etching end point, a second insulating film, a third insulating film containing an impurity for detecting a second etching end point and a fourth insulating film, these four films being laminated in this order;
   wherein the impurity concentration in each of the first and third insulating films is sufficient to cause the first and third insulating films to generate different spectral luminance of gas produced during etching than the second and fourth insulating films, respectively; and
   wherein the first insulating film containing the impurity for detecting the first etching end point and the third insulating film containing the impurity for detecting the second etching end point are selected from a $SiO_2$, a SiOF, a SiOC or a CF based film which is formed by a CVD method, and an SOG, HSQ (hydrogen silsesquioxane), an MSQ (methyl silsesqujoxane), a PAE (polyarylene ether) or a BCB (benzo cyclobutene) based film which is formed by coating.

7. A semiconductor device comprising:
an underlayer interconnect layer;
an interlayer dielectric film formed with a connection hole reaching the underlayer interconnect layer;
an upper interconnect layer buried in the connection hole;
wherein the interlayer dielectric film includes a first insulating film containing an impurity for detecting a first etching end point, a second insulating film, a third insulating film containing an impurity for detecting a second etching end point and a fourth insulating film, these four films being laminated in this order;
wherein the impurity concentration in each of the first and third insulating films is sufficient to cause the first and third insulating films to generate different spectral luminance of gas produced during etching than the second and fourth insulating films, respectively; and
wherein the first insulating film containing the impurity for detecting the first etching end point and the third insulating film containing the impurity for detecting the second etching end point each have a thickness of 10 to 50 $\mu$m.

8. A semiconductor device comprising:
an underlayer interconnect layer;
an interlayer dielectric film formed with a connection hole reaching the underlayer interconnect layer;
an upper interconnect layer buried in the connection hole;
wherein the interlayer dielectric film includes a first insulating film containing an impurity for detecting a first etching end point, a second insulating film, a third insulating film containing an impurity for detecting a second etching end point and a fourth insulating film, these four films being laminated in this order;
wherein the impurity concentration in each of the first and third insulating films is sufficient to cause the first and third insulating films to generate different spectral luminance of gas produced during etching than the second and fourth insulating films, respectively; and
wherein the interlayer dielectric film has a thickness of 500 to 2,000 nm.

9. A semiconductor device comprising:
an underlayer interconnect layer;
an interlayer dielectric film formed with a connection hole reaching the underlayer interconnect layer;
an upper interconnect layer buried in the connection hole;
wherein the interlayer dielectric film includes a first insulating film containing an impurity for detecting a first etching end point, a second insulating film, a third insulating film containing an impurity for detecting a second etching end point and a fourth insulating film, these four films being laminated in this order;
wherein the impurity concentration in each of the first and third insulating films is sufficient to cause the first and third insulating films to generate different spectral luminance of gas produced during etching than the second and fourth insulating films, respectively; and
wherein the first insulating film containing the impurity for detecting the first etching end point and the third insulating film containing the impurity for detecting the second etching end point each comprise phosphorus silicate glass.

10. A semiconductor device comprising:
an underlayer interconnect layer;
an interlayer dielectric film formed with a connection hole reaching the underlayer interconnect layer;
an upper interconnect layer buried in the connection hole;
wherein the interlayer dielectric film includes at least a first insulating film containing at least one impurity, a second insulating film, a third insulating film containing at least one impurity, and a fourth insulating film;
wherein impurity concentration in each of the first and third insulating films is sufficient to cause the first and third insulating films to generate different spectral luminance of gas produced during etching than the second and fourth insulating films, respectively;
wherein each of the first and third insulating films has an impurity concentration of 1–5 mol %.

11. The semiconductor device of claim 10, wherein each of the first and third insulating films has a dielectric constant of 4 or less.

12. The semiconductor device of claim 10, wherein each of the second and fourth insulating films comprises silicon oxide.

13. The semiconductor device of claim wherein at least one of P, Ar, B and F is provided as an impurity in at least one of the first and third insulating films.

14. A semiconductor device comprising:
an underlayer interconnect layer;
an interlayer dielectric film formed with a connection hole reaching the underlayer interconnect layer;
an upper interconnect layer buried in the connection hole;
wherein the interlayer dielectric film includes at least a first insulating film containing at least one impurity, a second insulating film, a third insulating film containing at least one impurity, and a fourth insulating film;
wherein impurity concentration in each of the first and third insulating films is sufficient to cause the first and third insulating films to generate different spectral luminance of gas produced during etching than the second and fourth insulating films, respectively; and
wherein at least one of the first and third insulating films has an impurity concentration of from 1–5 mol %.

15. A semiconductor device comprising:
an underlayer interconnect layer;
an interlayer dielectric film formed with a connection hole reaching the underlayer interconnect layer;
an upper interconnect layer buried in the connection hole;
wherein the interlayer dielectric film includes a first insulating film containing an impurity for detecting a first etching end point, a second insulating film, a third insulating film containing an impurity for detecting a second etching end point and a fourth insulating film, these four films being laminated in this order;
wherein the impurity concentration in each of the first and third insulating films is sufficient to cause the first and third insulating films to generate different spectral luminance of gas produced during etching than the second and fourth insulating films, respectively; and
wherein at least one of the first and third insulating films has an impurity concentration of from 1–5 mol %.

* * * * *